(12) United States Patent
Marshall et al.

(10) Patent No.: US 9,122,937 B2
(45) Date of Patent: Sep. 1, 2015

(54) TAMPER-RESISTANT HOUSING ASSEMBLY

(71) Applicants: Robert E. Marshall, Elizabethtown, PA (US); Robert W. Brown, Harrisburg, PA (US)

(72) Inventors: Robert E. Marshall, Elizabethtown, PA (US); Robert W. Brown, Harrisburg, PA (US)

(73) Assignee: FCI AMERICAS TECHNOLOGY LLC, Carson City, NV (US)

( * ) Notice: Subject to any disclaimer, the term of this patent is extended or adjusted under 35 U.S.C. 154(b) by 0 days.

(21) Appl. No.: 13/927,626

(22) Filed: Jun. 26, 2013

(65) Prior Publication Data

US 2014/0021254 A1 Jan. 23, 2014

Related U.S. Application Data

(60) Provisional application No. 61/674,814, filed on Jul. 23, 2012.

(51) Int. Cl.
| | |
|---|---|
| *G06K 7/00* | (2006.01) |
| *G06K 7/01* | (2006.01) |
| *H05K 5/02* | (2006.01) |
| *G07F 7/08* | (2006.01) |

(52) U.S. Cl.
CPC ............... *G06K 7/01* (2013.01); *G06K 7/0078* (2013.01); *G06K 7/0091* (2013.01); *G07F 7/0873* (2013.01); *H05K 5/0208* (2013.01); *Y10T 29/49117* (2015.01)

(58) Field of Classification Search
CPC ................................ G06K 17/00; G06K 7/008
USPC ................................... 235/435, 437, 439, 441
See application file for complete search history.

(56) References Cited

U.S. PATENT DOCUMENTS

| | | | |
|---|---|---|---|
| 4,593,384 A | 6/1986 | Kleijne | |
| 4,691,350 A | 9/1987 | Kleijne et al. | |
| 5,654,701 A | 8/1997 | Liao et al. | |
| 7,098,792 B1 * | 8/2006 | Ahlf et al. ................. | 340/568.1 |
| 7,671,741 B2 * | 3/2010 | Lax et al. ................... | 340/572.1 |
| 7,878,397 B2 * | 2/2011 | Mirkazemi-Moud et al. ............................. | 235/449 |
| 8,523,072 B2 * | 9/2013 | Randolph .................... | 235/439 |
| 2003/0137416 A1 | 7/2003 | Fu et al. | |
| 2008/0171465 A1 | 7/2008 | Lauriano et al. | |
| 2008/0296377 A1 | 12/2008 | Hopt et al. | |
| 2010/0171202 A1 | 7/2010 | Tian et al. | |
| 2011/0255253 A1 | 10/2011 | Campbell et al. | |
| 2013/0140364 A1 | 6/2013 | McJones et al. | |

OTHER PUBLICATIONS

International Patent Application No. PCT/US2013/050268: International Search Report dated Oct. 23, 2013, 13 pages.

* cited by examiner

*Primary Examiner* — Daniel St Cyr
(74) *Attorney, Agent, or Firm* — Baker & Hostetler LLP

(57) ABSTRACT

A tamper-resistant housing assembly may include an internal housing that is wrapped in a flex circuit. The flex circuit can cover an outside surface of the internal housing and can carry a conductive electrical trace. The electrical trace can define a continuous electrical path from a first contact pad to a second contact pad, such that piercing the an outer surface of the housing through to the inner surface of the housing interrupts the continuous electrical path.

22 Claims, 6 Drawing Sheets

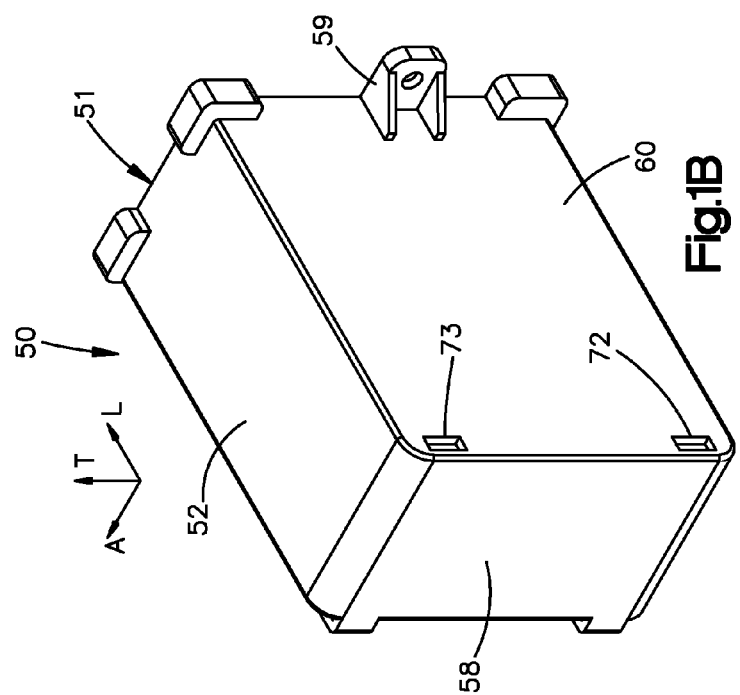
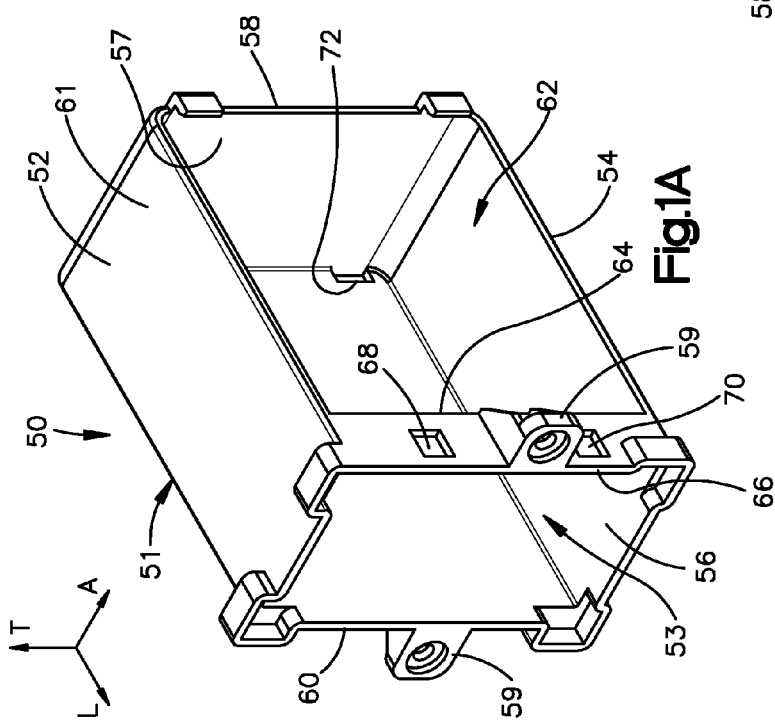

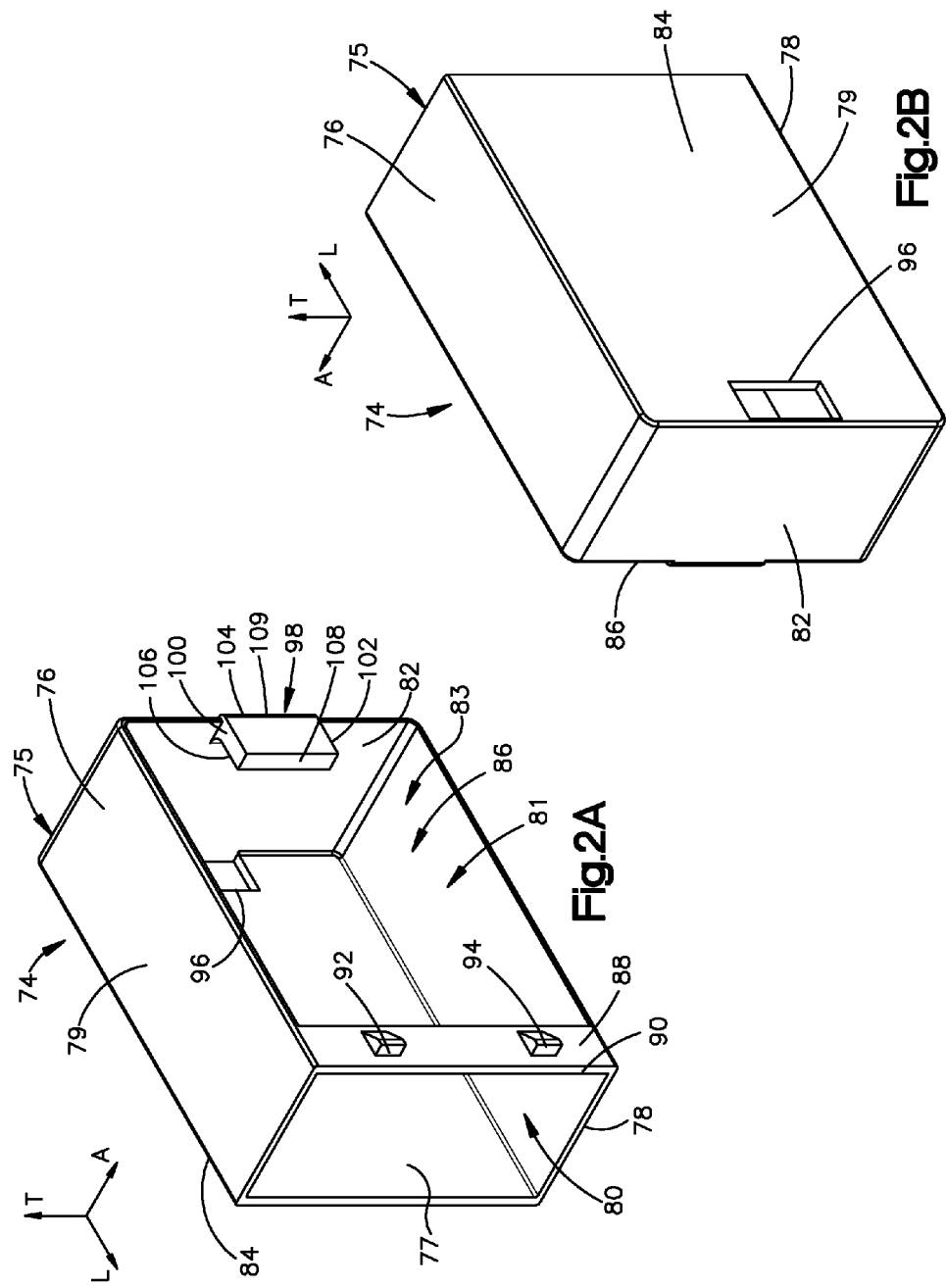

TAMPER-RESISTANT HOUSING ASSEMBLY

CROSS-REFERENCE TO RELATED APPLICATIONS

This claims the benefit of U.S. Provisional Patent Application Ser. No. 61/674,814 filed Jul. 23, 2012, the disclosure of which is hereby incorporated by reference as if set forth in its entirety herein.

BACKGROUND

Electrical devices may reside in a housing, for example, to protect electrical components. It may be desirable to limit tampering to electrical devices that reside in a housing. For instance, limiting tampering to a card reader may prevent eavesdropping of information contained on credit cards and/or debit cards.

SUMMARY

In accordance with one embodiment, a tamper-resistant housing assembly comprises an electrically insulative housing and a flex circuit. The electrically insulative housing can comprise a housing body that defines a front end and a rear end that is spaced from the front end along a first direction, a first side and a second side that is spaced from the first side along a second direction that is substantially perpendicular to the first direction, and a bottom end and a top end that is spaced from the bottom end along a third direction that is substantially perpendicular to both the first and second directions. The housing body defines an inner surface that at least partially defines an interior void and an outer surface that is opposite the inner surface. At least a portion of each of the front end and the second side are open into the interior void. The flex circuit includes a main body portion and at least one tab that extends from the main body portion. The main body portion can attach to at least two select outer surfaces of the housing. The select outer surfaces of the housing are defined by at least two of the first side, the top end, the bottom end, and the rear end. The at least one tab can be disposed at least proximate to the second side of the housing body. The flex circuit defines a first and second electrical contact pad carried by the at least one tab, and the flex circuit defines a single electrical trace that extends from the first contact pad along the main body portion to the second contact pad. The single electrical trace defines a continuous electrical path from the first contact pad to the second contact pad, such that piercing the select outer surface through to the inner surface interrupts the continuous electrical path.

BRIEF DESCRIPTION OF THE DRAWINGS

The foregoing summary, as well as the following detailed description of an example embodiment, are better understood when read in conjunction with the appended drawings. For the purposes of illustrating a tamper-resistant housing assembly, the drawings show an example embodiment that includes an external housing and an internal housing wrapped in a flex circuit. The invention is not limited, however, to the specific instrumentalities shown in the drawings. In the drawings:

FIG. 1A is a front perspective view of an external housing constructed in accordance with one embodiment;

FIG. 1B is a back perspective view of the external housing illustrated in FIG. 1A;

FIG. 2A is a front perspective view of an internal housing;

FIG. 2B is a back perspective view of the internal housing illustrated in FIG. 2A;

DETAILED DESCRIPTION

Figure 5:
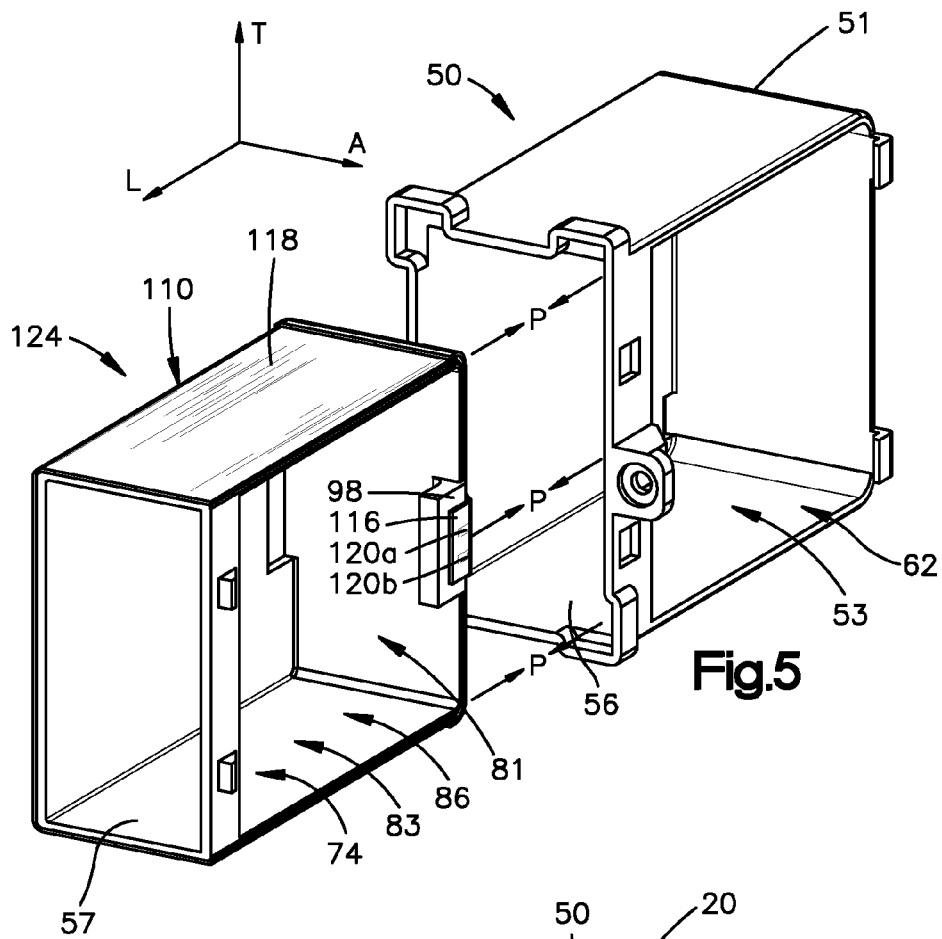
FIGS. 5 illustrates an example assembly for attaching an internal housing with a flex circuit to an external housing.
Figure 6:
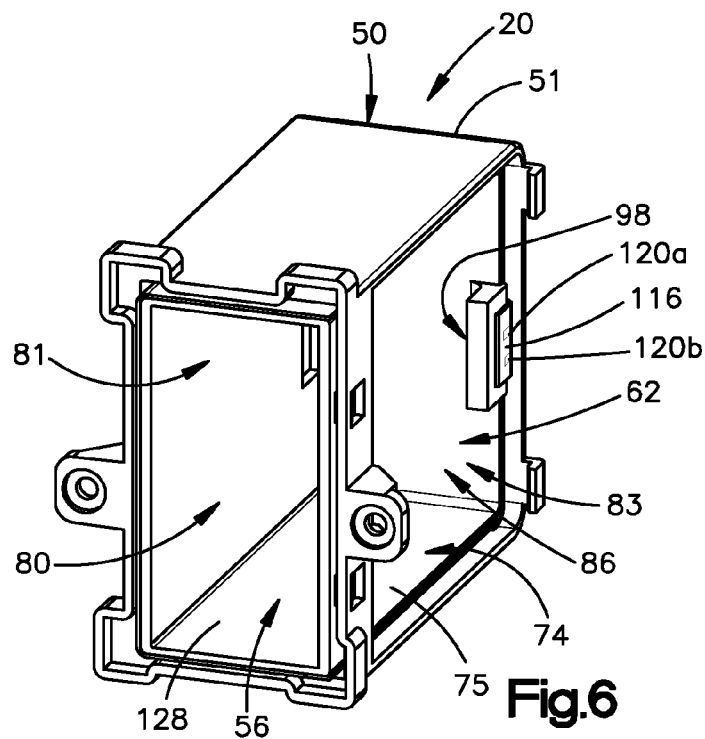
FIG. 6 is a front perspective view of a tamper-resistant housing assembly comprising an internal housing, flex circuit, and an external housing.

Referring to FIGS. 5-6, a tamper-resistant housing assembly 20 includes an electrically insulative first or external housing 50 and an electrically insulative second or internal housing 74. The tamper-resistant housing assembly 20 can also be referred to as a tamper-evident housing assembly, without limitation. The external housing 50 that defines a first interior void 53 that is configured such that the internal housing 74 is insertable into the interior void 53 and configured to nest in the first interior void 53 of the external housing 50. The tamper-resistant housing assembly 20 further includes a flex circuit 110 that is configured to be attached onto an outer surface of the internal housing 74 prior to insertion of the internal housing 74 into the interior void 53 of the external housing 50. Thus, when the internal housing 74 is inserted into the interior void 53 of the external housing 50, the flex circuit 110 is disposed between the external housing 50 and the internal housing 74. The internal housing 74 defines an interior void 81 that can contain circuitry as desired, for instance of a card reader. The tamper-resistant housing assembly 20 is configured such that when one attempts to tamper with the external housing and internal housing 74 in order to access an interior void 81 of the internal housing 74, and thus access the circuitry that is disposed in the interior void 81, an electrical trace that is carried by the flex circuit 110 is configured to rupture, thereby disrupting an electrical circuit that is defined by the electrical trace. For instance, if the electrical trace is broken so as to no longer define a continuous electrical trace, a card reader can be disabled such that a credit card or debit card can no longer be read. A sensor can detect the disruption and an actuator can take a predetermined action, such as discontinuing power to the circuitry disposed in the interior void 81, actuating an alarm, or the like.

For convenience, the same or equivalent elements in the various embodiments illustrated in the drawings have been identified with the same reference numerals. Certain terminology is used in the following description for convenience only and is not limiting. The words "left," "right," "front," "rear," "upper," and "lower" designate directions in the drawings to which reference is made. The words "forward," "forwardly," "rearward," "inner," "inward," "inwardly," "outer," "outward," "outwardly," "upward," "upwardly," "downward," and "downwardly" refer to directions toward and away from, respectively, the geometric center of the object referred to and designated parts thereof. The terminology intended to be non-limiting includes the above-listed words, derivatives thereof and words of similar import.

Referring to FIGS. 1A and 1B, the external housing 50 is dielectric or electrically insulative, and can be substantially rectangular in shape or can define any suitable shape as desired. In accordance with the illustrated embodiment, the external housing 50 includes a housing body 51 that defines a front end 56 and an opposed rear end 58 that is spaced from the front end 56 along a first or longitudinal direction L. The housing body 51 further defines a first side 60 and a second side 62 that is opposite the first side 60 and spaced from the first side 60 along a second or lateral direction A that is substantially perpendicular to the longitudinal direction L. The housing body 51 further defines a top end 52 and an opposed bottom end 54 that is opposite the top end 52 and spaced from the top end 52 along a third or transverse direction T that is substantially perpendicular to both the longitudinal direction L and the lateral direction A. In accordance with the illustrated embodiment, the transverse direction T is oriented vertically, and the longitudinal and lateral directions L and A are oriented horizontally, although the orientation of the external housing 50 may vary during use. In accordance with the illustrated embodiment, the external housing 50 is illustrated as elongate in the longitudinal direction L, although it will be appreciated that the shape of the external housing can vary as desired.

Still referring to FIGS. 1A and 1B, the housing body 51 defines an inner surface 57 that at least partially defines the interior void 53, and an outer surface 61 that is opposite the inner surface 57. At least a portion of the second side 62 of the housing body 51 can be substantially open to the interior void 53, for instance along the lateral direction A. At least a portion of the second side 62 can include a closed portion 64 that is disposed proximate to the front end 56 and extends from the top end 52 to the bottom end 54. The closed portion 64 can be spaced from the rear end 58, such that the open portion of the second side is defined between the closed portion 64 and the rear end 58 along the longitudinal direction L, and is further defined between the top end 52 and the bottom end 54 along the transverse direction T. The closed portion 64 of the second side 62 can be substantially rectangular or alternatively shaped, and is elongate in the transverse direction T, such that the closed portion 64 connects to the top end 52 and the bottom end 54.

The closed portion 64 defines front edge 66 that extends along the transverse direction T proximate to the front end 56 of the housing body 51. The closed portion 64 defines at least one engagement member which can be configured as a slot, such as first and second slots 68 and 70, respectively. In accordance with the illustrated embodiment, the first and second slots 68 and 70 are configured as two substantially rectangular apertures that extend at least into or through the closed portion 64, for instance along the lateral direction A. It should be appreciated that the shape of the slots and the number of slots may vary. In accordance with the illustrated embodiment, the first slot 68 is disposed proximate to the top end 52 and the second slot 70 is disposed proximate to the bottom end 54, such that the first slot 68 is disposed above the second slot 60, though the placement of the slots 68 and 70 on the closed portion 64 may vary.

While at least a portion of the second side 62 can be open to the interior void 53 as described above, at least a portion up to substantially all of the first side 60 can be closed, and thus extend from front end 56 to the rear end 58 along the longitudinal direction L, and from the top end 52 to the bottom end 54 along the transverse direction T. While substantially all of the first side 60 can be closed, the first side 60 can define at least one aperture, such as first and second apertures 72 and 73 that extend through to the interior void 53 as desired. The first aperture 72 may be disposed in a corner of the first side 60 that is proximate to the bottom end 54 and the rear end 58, and the second aperture 73 may be disposed in a corner of the first side 60 that is proximate to the top end 52 and the rear end 58. As described herein, the slots 68 and 70 may operatively engage latch features to attach, for example, an internal housing to the external housing 50.

With continuing reference to FIGS. 1A and 1B, at least a portion of the front end 56 of the housing body 51 can be substantially open to the interior void 53, for instance along the longitudinal direction L. At least a portion up to substantially all of the rear end 58 can be closed, and thus extend from first side 60 to the second side 62 along the lateral direction A, and from the top end 52 to the bottom end 54 along the transverse direction T. While substantially all of the rear end 58 can be closed, it should be appreciated that the housing body 51 can define one or more openings that extend through the rear end 58 into the interior void 53 as desired.

With further reference to FIGS. 1A and 1B, at least a portion up to substantially all of the top and bottom ends 52 and 54 can be closed. For instance, the top end 52 can extend from the first side 60 to the second side 62 along the lateral direction A, and from the front end 56 to the rear end 58 along the longitudinal direction L. Similarly, the bottom end 54 can extend from the first side 60 to the second side 62 along the lateral direction A, and from the front end 56 to the rear end 58 along the longitudinal direction L. Thus, it should be appreciated that the external housing 50 can define at least one such as a pair of ends that are open to the interior void 53, and a remainder of ends that at least partially close the interior void 53. In accordance with the illustrated embodiment, the pair of ends that are open to the interior void 53 can be defined by the front end 56 and the second side 62, and the closed ends can be defined by the rear end 58, the first side 60, and the top and bottom ends 52 and 54. It should be appreciated that the open ends can extend through any of the ends and sides of the housing body 51 as desired.

Various structures are described herein as extending horizontally along a first or longitudinal direction "L" and a second or lateral direction "A" that is substantially perpendicular to the longitudinal direction L, and vertically along a third or transverse direction "T" that is substantially perpendicular to the longitudinal and lateral directions L and A, respectively. As illustrated, the longitudinal direction "L" extends along a forward/rearward direction of the tamper-resistant housing assembly 20, and defines a direction P along which one or both of the internal and external housings 74 and 50 are moved relative to the other so as to insert the internal housing 74 into the external housing 50. As illustrated, the lateral direction "A" extends along a width of the tamper-resistant housing assembly 20, and the transverse direction "T" defines a height of the tamper-resistant housing assembly 20.

As described above, and referring now to FIGS. 2A and 2B, the internal housing 74 is insertable into the interior void 53 of the external housing 50, such that the internal housing 74 nests in the external housing 50. The internal housing 74 is dielectric or electrically insulative, and can be substantially rectangular in shape or can define any suitable shape as desired. In accordance with the illustrated embodiment, the internal housing 74 includes a housing body 75 that defines a front end 80 and an opposed rear end 82 that is spaced from the front end 80 along the first or longitudinal direction L. The housing body 75 further defines a first side 84 and a second side 86 that is opposite the first side 84 and spaced from the first side 84 along the second or lateral direction A that is substantially perpendicular to the longitudinal direction L. The housing body 75 further defines a top end 76 and an opposed bottom end 78 that is opposite the top end 76 and spaced from the top end 76 along a third or transverse direction T that is substantially perpendicular to both the longitudinal direction L and the lateral direction A.

Still referring to FIGS. 1A and 1B, the housing body 51 defines an inner surface 77 that at least partially defines an interior void 81 of the internal housing 74, and an outer surface 79 that is opposite the inner surface 77. At least a portion of the second side 86 of the housing body 75 can be substantially open to the interior void 81, for instance along the lateral direction A. At least a portion of the second side 86 can include a first wall, such as a front wall disposed proximate to the front end 80 and extends between the top end 76 and the bottom end 78. The front wall can extend from the top end 76 to the bottom end 78 so as to define a closed portion 88. The closed portion 88 can be spaced from the rear end 82, such that the open portion of the second side 86 is defined between the closed portion 88 and the rear end 82 along the longitudinal direction L, and is further defined between the top end 76 and the bottom end 78 along the transverse direction T. The closed portion 88 of the second side 86 can be substantially rectangular or alternatively shaped, and is elongate in the transverse direction T, such that the closed portion 88 connects to the top end 76 and the bottom end 78.

The closed portion 88 defines a front edge 90 that extends along the transverse direction T proximate to the front end 80 of the housing body 75. The closed portion 88 defines at least one engagement member that is configured to mate with the at least one engagement member of the external housing 50 so as to attach the internal housing 74 to the external housing 50 when the internal housing 74 is nested in the interior void 53 of the external housing 50. The at least one engagement member of the internal housing 74 can be configured as a latch, such as first and second latches 92 and 94, respectively. In accordance with the illustrated embodiment, the first and second latches 92 and 94 are sized to extend into the respective first and second slots 68 and 70, respectively, so as to attach the internal housing 74 to the external housing 50 when the internal housing 74 is nested in the interior void 53 of the external housing 50. In accordance with the illustrated embodiment, the first latch 92 is disposed proximate to the top end 76, and the second latch 94 is disposed proximate to the bottom end 78, such that the first latch 92 is disposed above the second latch 94, though the placement of the latches 92 and 94 may vary. It should be appreciated in accordance with an alternative embodiment that the engagement member of the internal housing 74 can be configured as slots of the type described herein, and the engagement member of the external housing 50 can be configured as latches of the type described herein.

While at least a portion of the second side 86 can be open to the interior void 81 as described above, at least a portion up to substantially all of the first side 84 can be closed, and thus extend from the front end 80 to the rear end 82 along the longitudinal direction L, and from the top end 76 to the bottom end 78 along the transverse direction T. While substantially all of the first side 84 can be closed, the first side 84 can define at least one aperture, such as an aperture 96 that is open into the interior void 81. The aperture 96 can extend through the first side 84 that is proximate to the rear end 82. The aperture 96 can be substantially rectangular and present longitudinally opposed edges that extend in the transverse direction T, though it should be appreciated that the aperture 96 can have any shape as desired. Further, it should be appreciated that the aperture 96 can be positioned as desired. In accordance with the illustrated embodiment, the aperture 96 can be substantially equidistantly spaced from the top end 76 and the bottom end 78.

With continuing reference to FIGS. 2A-B, at least a portion of the front end 80 of the housing body 75 can be substantially open to the interior void 81, for instance along the longitudinal direction L. At least a portion up to substantially all of the rear end 82 can be closed, and thus extend from the first side 84 to the second side 86 along the lateral direction A, and from the top end 76 to the bottom end 78 along the transverse direction T. The rear end 82 can be defined by a second wall, such as a rear wall, that extends between the top end 76 and the bottom end 78, and further extends between the first side 84 and the second side 86. While substantially all of the rear end 82, and the rear wall that defines the rear end 82, can be closed, it should be appreciated that the housing body 75 can define one or more openings that extend through the rear end 82 into the interior void 81 as desired.

With further reference to FIGS. 2A and 2B, at least a portion up to substantially all of the top and bottom ends 76 and 78 can be closed. For instance, the top end 76 can extend from the first side 84 to the second side 86 along the lateral direction A, and from the front end 80 to the rear end 82 along the longitudinal direction L. Similarly, the bottom end 78 can extend from the first side 84 to the second side 86 along the lateral direction A, and from the front end 80 to the rear end 82 along the longitudinal direction L. Thus, it should be appreciated that the internal housing 74 can define at least one such as a pair of ends that are open to the interior void 81, and a remainder of ends that at least partially close the interior void 81. In accordance with the illustrated embodiment, the pair of ends that are open to the interior void 81 can be defined by the front end 80 and the second side 86, and the closed ends can be defined by the rear end 82, the first side 64, and the top and bottom ends 76 and 78. It should be appreciated, of course, that the open ends can extend through any of the ends and sides of the housing body 75 as desired.

Referring to FIG. 2A, the internal housing 74 can define an opening 83 that extends through the housing body 75. For instance, the opening 83 can be defined by the second side 86 of the electrically insulative housing 84, which can thus be referred to as an open second side. The opening 83 can extend from the outer surface 79 through the housing body 75 to the inner surface 77 and into the second interior void defined by the interior void 81. The opening 83 can be at least partially defined by and between the rear wall that defines the rear end 82, the front wall that defines the closed portion 88, the top end 76, and the bottom end 78. In accordance with the illustrated embodiment, the internal housing 75 can further define a tab platform 98 that extends from the housing body 75 and at least partially along the open second side 86, such that at least a portion of the tab platform 98 is aligned with the opening 83 along the lateral direction A. The tab platform 98 can extend from the first wall toward the second wall. While the first and second wall can define front and rear walls, respectively, as described above, the first and second walls can alternatively define any two walls that at least partially define an opening, such as the opening 83, therebetween. Thus, the opening 83 can be positioned at any suitable location as desired.

The tab platform 98 defines an inner surface 106 that faces the interior void 81, and an opposed outer surface 104 that is opposite the inner surface 106 and faces away from the interior void 81. For instance, the tab platform 98 is aligned with the opening 83 along a direction normal to the inner surface 106. The tab platform 98 can extend over the opening 83, such that the inner surface 106 faces the interior void 81 through the opening 83, or the tab platform 83 can be substantially aligned with the first and second walls along the longitudinal direction L, such that the tab platform 93 partially defines the opening 83. The tab platform 98 can be substantially rectangular shaped or alternatively shaped as desired, and further defines a top end 100 an opposed bottom end 102 that are each connected between the inner surface 106 and the outer surface 104, and front and rear ends 108 and 109 that are connected between the top and bottom ends 100 and 102, and further connected between the inner surface 106 and outer surface 104. The front end 108 can be substantially parallel to the front end 80 or oblique to the front end 80 as desired. The outer and inner surfaces 104 and 106 are spaced from each other along the lateral direction A, and the top and bottom ends 100 and 102 are spaced from each other along the transverse direction T. In accordance with the illustrated embodiment, the top end 100 of the tab platform 98 is spaced from the top end 76 of the housing body 75 a first distance, and the bottom end 102 of the tab platform 98 is spaced from the bottom end 78 of the housing body 75 a second distance that can be equal to, greater than, or less than the first distance as desired. In accordance with the illustrated embodiment, the tab platform 98 is illustrated as elongate in the transverse direction T, although embodiments are not so limited.

Figure 3A:
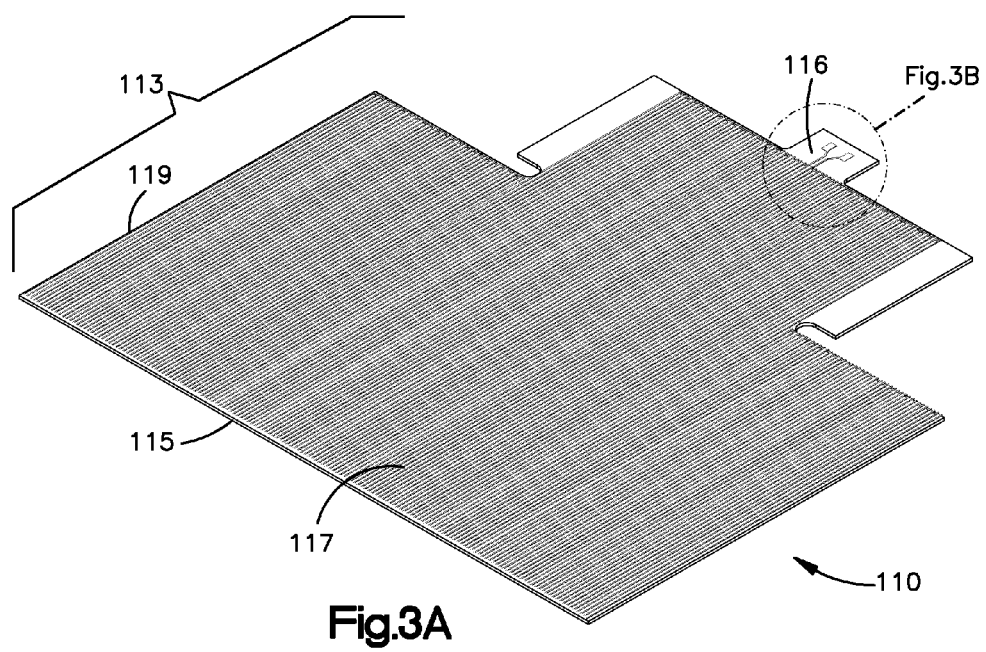
FIG. 3A is an unwrapped view of a flex circuit constructed in accordance with one embodiment.
Figure 3B:
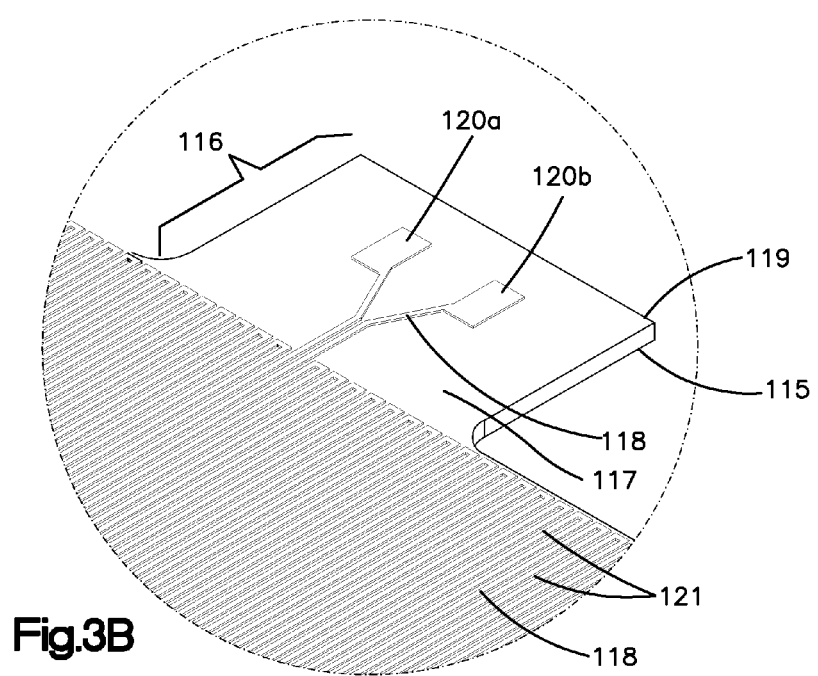
FIG. 3B is an enhanced view of the flex circuit illustrated in FIG. 3A, showing a tab that carries electrical contact pads of the flex circuit.

As described above, and referring now to FIGS. 3A and 3B, the tamper-resistant housing assembly 20 includes the flex circuit 110. In accordance with the illustrated embodiment, the flex circuit can include a first or main body portion 113 and a second portion that can be configured as at least one tab 116 that extends out from the main body portion 113. As will be described in more detail below, the main body portion 113 is configured to be attached to at least two select outer surfaces of the internal housing 74, the select outer surfaces of the internal housing 74 defined by at least two of the first side 84, the top end 76, the bottom end 78, and the rear end 82. For instance, the main body portion 113 can be attached to the outer surface 79 of the housing body 75, for instance at the first side 84, the top end 76, the bottom end 78, and the rear end 82. The tab 116 can be disposed at least proximate to the second side 86 of the housing body 75. For instance, the tab 116 can be attached to the tab platform 98, and in particular to the outer surface 104 of the tab platform 98.

The flex circuit 110 defines an inner surface 115 that is configured to attach to and face the housing body 75 of the internal housing 74, and an outer surface 117 that is opposite the inner surface 115 and faces the housing body 51 of the external housing 50. The flex circuit 110 includes an electrically insulative material 119 and an electrical trace 118 that is carried by the electrically insulative material 119. For instance, the electrical trace 118 can be embedded in the electrically insulative material 119 or carried by the inner surface 115 or outer surface 117. The electrically insulative material 119 can be monolithic along an entirety of the electrical trace 118, which can be referred to as a single electrical trace. The electrical trace 118 can extend along the main body portion 113, and can define first and second terminal ends that terminate at respective first and second electrical contact pads 120a and 120b that are carried by the tab 116. Thus, the electrical trace 118 can be referred to as a single continuous electrical trace 118 that defines a single continuous electrical path from the first contact pad 120a to the second contact pad 120b. For instance, the electrical trace 118 can define a serpentine pattern at the main body portion 113 that defines a plurality of rows 121 that are spaced from each other and at least partially aligned with each other along a direction that extends perpendicular to the rows. Thus, the electrical trace 118 can extend from the first contact pad 120a along the main body portion 113 to the second contact pad 120b. The rows defined by the electrical trace 118 can be spaced any distance as desired such that piercing the outer surface 79 of the housing body 75 through to the inner surface 77, as can be caused during tampering of the housing assembly 20, will sever at least one of the rows of the electrical trace 118, and thus interrupts the continuous electrical path defined by the electrical trace 118. The electrical trace 118, including the electrical contact pads 120, can be made of any suitable electrically conductive material as desired, such as a copper alloy. The electrical contact pads 120a and 120b can be sized to carry electrical communications or data signals, or to support DC and/or AC power.

Figure 4A:
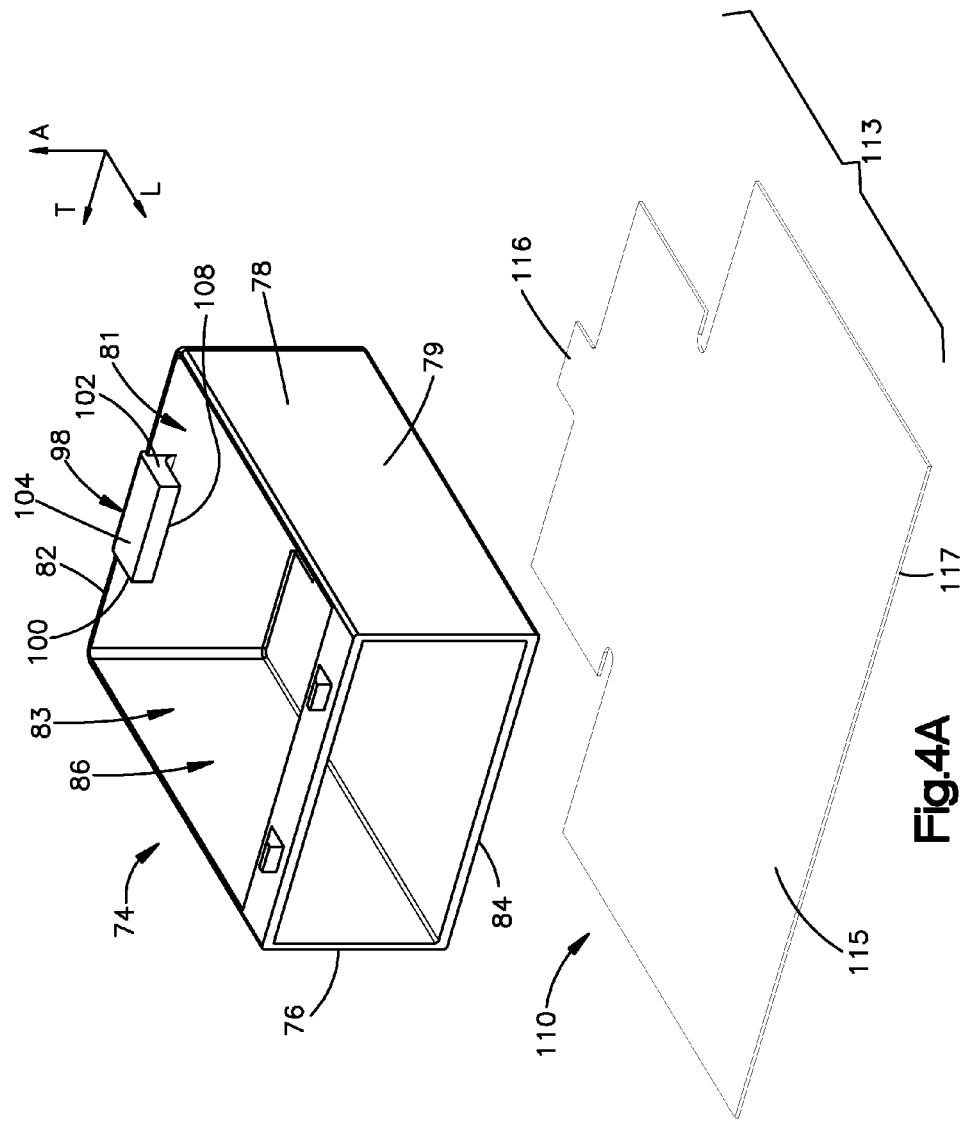
FIG. 4A illustrates the flex circuit shown in FIG. 3A aligned with the internal housing shown in FIGS. 2A and 2B for attachment to the internal housing in accordance with an example assembly.
Figure 4B:
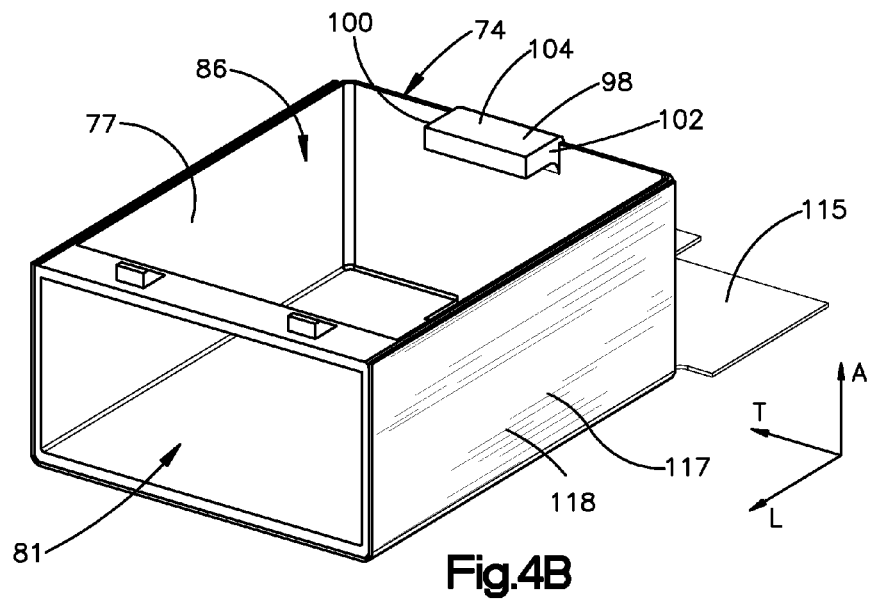
FIG. 4B illustrates the flex circuit shown in FIG. 3A partially attached to the internal housing shown in FIGS. 2A and 2B.
Figure 4C:
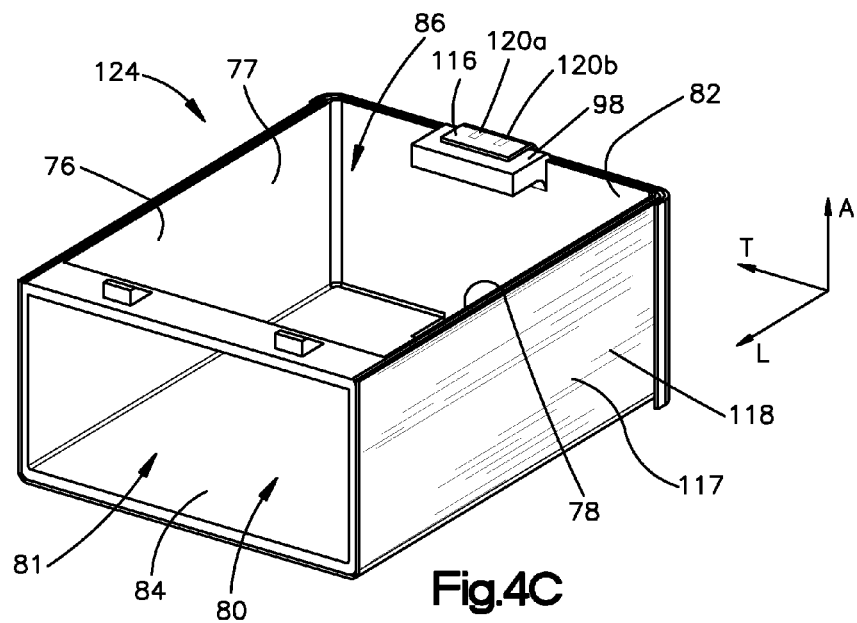
FIG. 4C illustrates a wrapped view of the flex circuit illustrated in FIG. 3A so as to be fully attached to the internal housing shown in FIGS. 2A and 2B.

Referring now to FIGS. 4A-C, the flex circuit 110 may be attached to the housing body 75 of the internal housing 74 so as to define a flex circuit assembly 124. For instance, the flex circuit 110 can be adhered to the housing body 75 of the internal housing 74, and in particular to the outer surface 79 of the housing body 75, using a pressure sensitive adhesive or the like, or otherwise attached to the outer surface 79 of the housing body 75 as desired. For example, adhesive may be applied to the outer surface 79 of the housing body 75 and/or to the inner surface 115 of the electrically insulative material 119. The outer surface 117 of the flex circuit 110 carries the electrical contact pads 120a and 120b such that the first and second electrical contact pads 120a and 120b face away from the interior void 81 when the tab 116 is attached to the tab platform 98.

Referring to FIG. 4B, the main body portion 113 of the flex circuit 110 wraps around the housing body 75, for instance at the outer surface 79, such that the main body portion 113 substantially covers at least part up to substantially all of the outer surface 79 of the top end 76, the first side 84, the bottom end 78, and the rear end 82 of the housing body 75. It should be appreciated that the main body portion 113, and in particular the electrically insulative material 119 of the main body portion 113, is a single monolithic portion of the flex circuit 110 that at least partially or substantially covers at least part up to substantially all of at least two or more up to all of the outer surface 79 of the top end 76, the first side 84, the bottom end 78, and the rear end 82 of the housing body 75. Thus, the surface area defined by the flex circuit 110 can be substantially equal to a cumulative surface area defined by the outer surface 79 of the top end 76, the first side 84, the bottom end 78, and the rear end 82 of the housing body 75. Furthermore, the single continuous electrical trace 118 extends over at least part up to all of at least two or more up to all of the outer surface 79 of the top end 76, the first side 84, the bottom end 78, and the rear end 82 of the housing body 75. The tab 116 of the flex circuit 110 is attached to the outer surface 104 of the tab platform 98. Thus, it should be appreciated that the flex circuit 110 has a first portion, such as the main body portion 113, that is attached to at least a portion of the outer surface 79 of the housing body 75, and a second portion, such as the tab 116, that is attached to the tab platform 98, the first portion carrying at least a portion of the electrical trace 118, and the second portion carrying at least one of the first and second electrical contact pads 120a-b, for instance both of the first and second electrical contact pads 120a-b. In accordance with the illustrated embodiment, the surface area of the tab 116 may be less than the surface area of the front end 108 of the tab platform 98. It should be appreciated that when the flex circuit 110 is attached to the internal housing 74, the main body portion 113 can avoid overlaying the at least two open ends of the housing body 75 of the inner housing member, which can be defined by the front end 80 and the second side 86, when the flex circuit 110 is attached to the housing body 75. In accordance with an alternative embodiment, the flex circuit 110 can overlay part or all of the open ends of the housing body 75.

Referring now to FIGS. 5-6, once the flex circuit 110 is attached to the internal housing 74, the flex circuit assembly 124, including the internal housing 74 and the flex circuit 110, can be inserted into the external housing 50, and in particular inserted into the interior void 53 of the housing body 51, such that the flex circuit 110 is disposed between the housing body 75 of the internal housing 74 and the housing body 51 of the external housing 50. For instance, in accordance with the illustrated embodiment, the flex circuit 110 is disposed between the outer surface 79 of the housing body 75 and the inner surface 57 of the housing body 51. In this regard it should be appreciated that while the flex circuit 110 has been described as attached to the outer surface 79, at least part of the flex circuit 110, such as the main body portion 113, can be attached to the inner surface 57. When the internal housing 74 is inserted into the external housing 50 along the direction P which can be the longitudinal direction L, and in particular into the interior void 53, 1) the front end 56 of the external housing body 51 is aligned with the front end 80 of the internal housing body 75, and 2) the second side 62 of the external housing body 51 is aligned with the second side 86 of the internal housing body 75.

Thus, in accordance with one embodiment, the tamper-resistant housing assembly 20 can include 1) the electrically insulative external housing 50 that defines a first interior void, which can be defined by the interior void 53, and 2) the electrically insulative internal housing 74 nested in the first interior void 53 of the electrically insulative external housing 50, the electrically insulative internal housing defining a second interior void that can be defined by the interior void 81. The tamper-resistant housing assembly 20 can further include the flex circuit 110 that is disposed between the external housing 50 and the internal housing 74, the flex circuit 110 including the continuous electrical trace 118 terminating at opposed ends at the respective first and second electrical contact pads 120a and 120b. The electrical contact pads 120a and 120b can be disposed adjacent the opening 83.

As illustrated in FIGS. 5, an example method for attaching the flex circuit assembly 124 to the external housing 50 includes sliding or otherwise inserting the flex circuit assembly 124 into the interior void 53 of the external housing 50 along the direction P such that the tab 116 is exposed to the second side 86 the housing body 75, and further extends along the second side 62 of the housing body 51. The latches 92 and 94 of the internal housing 74 align with and lock into the respective slots 68 and 70 of the external housing 50, thereby coupling the internal housing 74 inside the external housing 50.

Referring now to FIG. 6, the tamper-resistant housing assembly 20 includes the internal housing 74 and the flex circuit 110 disposed in the external housing 50. In one embodiment, the electrical contact pads 120 are configured to electrically couple to a printed circuit board (PCB) that can extend across and close the second side 62 of the housing body 51 of the external housing 50. For example, compression connections may electrically couple the electrical contact pads 120a and 120b to the PCB. The PCB may carry a sensor that is configured to sense a current or a signal that is carried by the electrical trace 118. If there is a disruption to the electrical path defined by the electrical trace 118, the sensor can identify the disruption and remove power to the PCB, thus protecting the electrical device, which is housed in the interior voids 53 and 81 and electrically connected to the PCB, from tampering. For example, if a hole is drilled into the internal housing 74 for eavesdropping purposes, the sensor carried by the PCB will identify a disruption in the electrical path that is defined by the electrical trace 118. The PCB will respond to a disruption by removing power or clearing memory, for example, to the electrical circuitry (for instance a card reader) that is disposed in the interior void 81. The open end 128 of the card reader assembly is configured to receive a card, such as a credit card or debit card, in a receptacle that can be positioned at the front end 56 of the housing body 51 of the external housing 50, in order to read information via a magnetic strip on the card. As illustrated in FIG. 1A, the housing body 51 can define one or more attachment members 59 that are configured to attach to a receptacle assembly that defines the card-receiving receptacle. The information read from the inserted card may thus be protected through the use of the flex circuit 110 in combination with a PCB electrically coupled to the electrical contact pads 120 of the flex circuit 110.

In accordance with one embodiment, a method of fabricating a card reader can include the steps of 1) attaching a first portion of a flex circuit around at least two outer surfaces of an electrically insulative internal housing, the outer surfaces disposed opposite respective inner surfaces that at least partially define an interior void of the internal housing, the first portion of the flex circuit comprising a continuous electrical trace, 2) attaching a second portion of the flex circuit to a tab platform of the internal housing, the second portion including at least one of a first electrical contact pad and a second electrical contact bad that define respective opposed terminations of the continuous electrical trace, 3) placing the internal housing inside of an electrically insulative external housing, and 4) securing the internal housing to the external housing such that the tab platform, and thus the second portion of the flex circuit, is disposed adjacent an opening of the external housing that extends into an interior void of the external housing.

In accordance with another embodiment, in a system comprising 1) the electrically insulative external housing 50 that defines the first interior void 53, 2) an electrically insulative internal housing 74 nested in the first interior void 53 of the electrically insulative external housing 50, the electrically insulative internal housing 74 defining a second interior void, and 3) the flex circuit 110 disposed between the external housing 50 and the internal housing 74, the flex circuit 110 comprising the continuous electrical trace 118 terminating at opposed ends at respective first and second electrical contact pads 120a and 120b disposed adjacent the opening 83 that extends through the electrically insulative internal housing 50 and into the second interior void, a method of detecting tampering to a card reader contained within the second interior void is performed that includes sensing current through the continuous electrical trace 118, identifying a disruption in the continuous electrical trace 118, and in response to the identifying step, removing power from the card reader.

The embodiments described in connection with the illustrated embodiments have been presented by way of illustration, and the present invention is therefore not intended to be limited to the disclosed embodiments. Furthermore, the structure and features of each the embodiments described above can be applied to the other embodiments described herein, unless otherwise indicated. Accordingly, the invention is intended to encompass all modifications and alternative arrangements included within the spirit and scope of the invention, for instance as set forth by the appended claims.

What is claimed:
1. A tamper-resistant housing assembly comprising:
an electrically insulative housing comprising a housing body that defines a front end and a rear end that is spaced from the front end along a first direction, a first side and a second side that is spaced from the first side along a second direction that is substantially perpendicular to the first direction, and a bottom end and a top end that is spaced from the bottom end along a third direction that is substantially perpendicular to both the first and second directions, wherein the housing body defines an inner surface that at least partially defines an interior void and an outer surface that is opposite the inner surface, and at least a portion of each of the front end and the second side are open into the interior void; and
a flex circuit including a main body portion and at least one tab that extends from the main body portion at a location at least proximate to the second side of the housing body, the main body portion attached to at least two select outer surfaces of the housing, the select outer surfaces of the housing defined by at least two of the first side, the top end, the bottom end, and the rear end, the flex circuit defining first and second electrical contact pads carried by the at least one tab, the flex circuit further defining a single electrical trace that extends from the first contact pad along the main body portion to the second contact pad,
wherein the single electrical trace defines a continuous electrical path from the first contact pad to the second contact pad, such that piercing the select outer surface through to the inner surface interrupts the continuous electrical path, and the housing further includes a tab platform that extends from the housing body and at least partially along the open side, and the tab is attached to the tab platform.

2. The tamper-resistant housing assembly as recited in claim 1, wherein the main body portion is attached to the outer surface of the first side, the top end, the bottom end, and the rear end.

3. The tamper-resistant housing assembly as recited in claim 2, wherein the main body portion is a single monolithic portion.

4. The tamper-resistant housing assembly as recited in claim 2, wherein the main body portion does not overlay either the front end or the second side when the flex circuit is attached to the housing body.

5. The tamper-resistant housing assembly as recited in claim 1, wherein the tab platform extends from the rear end and defines an inner surface that faces the interior void and an opposed outer surface, and the tab is attached to the outer surface of the tab platform.

6. The tamper-resistant housing assembly as recited in claim 5, wherein the first and second contact pads face away from the interior void when the tab is attached to the tab platform.

7. The tamper-resistant housing assembly as recited in claim 1, wherein the electrical trace defines a serpentine pattern that defines a plurality of rows that are spaced from each other and at least partially aligned with each other along a direction that extends perpendicular to the rows.

8. The tamper-resistant housing assembly as recited in claim 1, wherein the housing is an internal housing and the housing body is an internal housing body, the tamper-resistant housing assembly further comprising an electrically insulative external housing that includes an external housing body, the external housing body defining a front end and a rear end that is spaced from the front end along a first direction, a first side and a second side that is spaced from the first side along a second direction that is substantially perpendicular to the first direction, and a bottom end and a top end that is spaced from the bottom end along a third direction that is substantially perpendicular to both the first and second directions, wherein the housing body defines an inner surface that at least partially defines an interior void and an outer surface that is opposite the inner surface, and at least a portion of each of the front end and the second sides is open into the interior void;
wherein the internal housing is insertable into the interior void of the external housing such that 1) the front end of the external housing body is aligned with the front end of the internal housing body, and 2) the second side of the external housing body is aligned with the second side of the internal housing body.

9. The tamper-resistant housing assembly as recited in claim 1, wherein the flex circuit defines a surface area that is substantially equal to a cumulative surface area defined by the outer surface of the top end, the first side, the bottom end, and the rear end.

10. A tamper-resistant housing assembly comprising:
an electrically insulative housing having a housing body that defines an inner surface that partially defines an interior void and an outer surface that is opposite the inner surface, the electrically insulative housing including a first wall and a second wall, the electrically insulative housing defining an opening that extends from the outer surface through the housing body to the inner surface at a location between the first and second walls, and a tab platform that extends from the second wall toward the first wall; and
a flex circuit that carries first and second electrical contact pads and an electrical trace that extends from the first electrical contact pad to the second electrical contact pad, the flex circuit having a first portion that is attached to at least a portion of the outer surface of the housing body and a second portion that is attached to the tab platform, the first portion carrying at least a portion of the electrical trace, and the second portion carrying at least one of the first and second electrical contact pads.

11. The tamper-resistant housing assembly as recited in claim 10, wherein the second portion of the flex circuit carries both the first and second electrical contact pads.

12. The tamper-resistant housing assembly as recited in claim 11, wherein the tab platform defines an inner surface that faces the interior void and an opposed outer surface, and the second portion of the flex circuit is attached to the outer surface of the tab platform.

13. The tamper-resistant housing assembly as recited in claim 12, wherein the inner surface of the tab platform is aligned with the opening along a direction normal to the inner surface of the tab platform.

14. The tamper-resistant housing assembly as recited in claim 10, wherein the tab platform extends over the opening.

15. The tamper-resistant housing assembly as recited in claim 10, wherein the tab platform partially defines the opening.

16. A tamper-resistant housing assembly comprising:
an electrically insulative external housing that defines a first interior void;
an electrically insulative internal housing nested in the first interior void of the electrically insulative external housing, the electrically insulative internal housing defining a second interior void; and
a flex circuit disposed between the external housing and the internal housing, the flex circuit comprising only one continuous electrical trace terminating at opposed ends at respective first and second electrical contact pads, the electrical contact pads disposed adjacent an opening that is defined by the electrically insulative internal housing and extends into the second interior void.

17. The tamper-resistant housing assembly as recited in claim 16, the internal housing including a housing body that defines an inner surface that at least partially defines the second interior void and an outer surface that is opposite the inner surface, the flex circuit adhered to the outer surface.

18. The tamper-resistant housing assembly as recited in claim 17, wherein the continuous electrical trace defines a serpentine pattern that defines a plurality of rows that are spaced from each other and at least partially aligned with each other along a direction that extends perpendicular to the rows.

19. The tamper-resistant housing assembly as recited in claim 16, wherein the tamper-resistant housing assembly contains a card reader configured to read cards, and wherein the continuous electrical trace defines a continuous electrical path from the first electrical contact pad to the second contact pad such that interrupting the continuous electrical path disables the card reader from reading cards.

20. A method of fabricating a card reader, the method comprising:
   attaching a first portion of a flex circuit around at least two outer surfaces of an electrically insulative internal housing, the outer surfaces disposed opposite respective inner surfaces that at least partially define an interior void of the internal housing, the first portion of the flex circuit comprising a continuous electrical trace;
   attaching a second portion of the flex circuit to a tab platform of the internal housing, the second portion including at least one of a first electrical contact pad and a second electrical contact bad that define respective opposed terminations of the continuous electrical trace;
   placing the internal housing inside of an electrically insulative external housing; and
   securing the internal housing to the external housing such that the tab platform, and thus the second portion of the flex circuit, is disposed adjacent an opening of the external housing that extends into an interior void of the external housing.

21. The method of claim 20, wherein the internal housing comprises a housing body that defines a front end and a rear end that is spaced from the front end along a first direction, a first side and a second side that is spaced from the first side along a second direction that is substantially perpendicular to the first direction, and a bottom end and a top end that is spaced from the bottom end along a third direction that is substantially perpendicular to both the first and second directions, wherein at least a portion of each of the front end and the second side are open into the interior void, the method further comprising:
   attaching the first portion of the flex circuit to the outer surface of at least two of the first side, the top end, the bottom end, and the rear end.

22. The method of claim 21, the method further comprising:
   attaching the first portion of the flex circuit to the outer surface the first side, the top end, the bottom end, and the rear end.

\* \* \* \* \*

UNITED STATES PATENT AND TRADEMARK OFFICE
CERTIFICATE OF CORRECTION

PATENT NO. : 9,122,937 B2
APPLICATION NO. : 13/927626
DATED : September 1, 2015
INVENTOR(S) : Robert E. Marshall Page 1 of 1

It is certified that error appears in the above-identified patent and that said Letters Patent is hereby corrected as shown below:

Claims

At COL. 11 (claim 1), line 34, delete "open side" and substitute therefor --open second side--

At COL. 14 (claim 20), line 2, delete "bad" and substitute therefor --pad--

Signed and Sealed this
Second Day of February, 2016

Michelle K. Lee
*Director of the United States Patent and Trademark Office*